(12) United States Patent
Barajas Gonzalez et al.

(10) Patent No.: US 10,205,486 B2
(45) Date of Patent: Feb. 12, 2019

(54) PARALLEL TESTING OF A CONTROLLER AREA NETWORK BUS CABLE

(71) Applicant: International Business Machines Corporation, Armonk, NY (US)

(72) Inventors: Emmanuel Barajas Gonzalez, Guadalajara (MX); Shaun E. Harrington, Sahuarita, AZ (US); Benjamin K. Rawlins, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/629,613

(22) Filed: Jun. 21, 2017

(65) Prior Publication Data

US 2017/0288730 A1 Oct. 5, 2017

Related U.S. Application Data

(63) Continuation of application No. 14/620,105, filed on Feb. 11, 2015, now Pat. No. 9,768,834.

(51) Int. Cl.
*H04B 3/46* (2015.01)
*H04B 3/56* (2006.01)
*H04B 17/00* (2015.01)

(52) U.S. Cl.
CPC .................. *H04B 3/56* (2013.01); *H04B 3/46* (2013.01); *H04B 17/00* (2013.01)

(58) Field of Classification Search
CPC ........ G01R 19/00; G01R 27/28; G01R 31/02; G01R 31/08; G01R 35/04; G06F 7/00; G06F 9/44; G06F 11/20; G06F 11/36; G06F 13/00; G06F 13/40; G06F 15/00; G06F 19/00; H04B 3/46; H04B 3/56; H04B 17/00; H04B 17/15; H04L 7/00; H04L 9/38
USPC ...... 324/51, 66, 67, 539, 542, 628; 370/242; 375/219, 257, 354; 702/60, 89, 116, 183; 710/104; 714/4.5, 35, 38, 45; 717/106
See application file for complete search history.

(56) References Cited

U.S. PATENT DOCUMENTS

| | | |
|---|---|---|
| 4,471,293 A | 9/1984 | Schnack |
| 5,027,074 A | 6/1991 | Haferstat |
| 5,155,440 A | 10/1992 | Huang |

(Continued)

OTHER PUBLICATIONS

Gonzalez et al., U.S. Appl. No. 14/620,105, filed Feb. 11, 2015.

(Continued)

*Primary Examiner* — Shawkat M Ali
(74) *Attorney, Agent, or Firm* — Zilka-Kotab, P.C.

(57) ABSTRACT

A computer program product according to one embodiment includes a computer readable storage medium having program instructions embodied therewith, wherein the computer readable storage medium is not a transitory signal per se, the program instructions executable by a processing system to cause the processing system to perform a method that includes sending a data testing signal through a data lead of a cable via a first interface, sending a power signal through a power lead of the cable via the first interface, receiving and analyzing the data testing signal from the data lead of the cable via a second interface, and receiving and analyzing the power signal passing through the power lead of the cable via the second interface.

20 Claims, 8 Drawing Sheets

(56) References Cited

U.S. PATENT DOCUMENTS

| | | | |
|---|---|---|---|
| 5,420,512 A | 5/1995 | Spillane et al. | |
| 5,436,554 A | 7/1995 | Decker, Jr. | |
| 6,098,182 A | 8/2000 | Cowan | |
| 6,259,258 B1 | 7/2001 | Cook et al. | |
| 6,876,938 B2 | 4/2005 | Kattan | |
| 7,116,112 B1 | 10/2006 | Shu | |
| 7,945,358 B2 | 5/2011 | Avery et al. | |
| 8,395,393 B2 | 3/2013 | Betz et al. | |
| 9,223,742 B2 | 12/2015 | Mullins et al. | |
| 9,768,834 B2 | 9/2017 | Barajas Gonzalez et al. | |
| 2004/0054503 A1 | 3/2004 | Namaky | |
| 2004/0064273 A1 | 4/2004 | Le et al. | |
| 2005/0060116 A1 | 3/2005 | Yeung | |
| 2005/0060612 A1* | 3/2005 | Bohan | G06F 11/273 714/25 |
| 2005/0083067 A1 | 4/2005 | Kirbas | |
| 2005/0285450 A1* | 12/2005 | Brandt | H02J 13/002 307/140 |
| 2006/0214679 A1 | 9/2006 | Henson et al. | |
| 2006/0277524 A1 | 12/2006 | Goodman | |
| 2007/0279038 A1* | 12/2007 | Takada | G01R 29/027 324/76.25 |
| 2008/0316930 A1 | 12/2008 | Xu et al. | |
| 2009/0036115 A1 | 2/2009 | Chang | |
| 2012/0151247 A1 | 6/2012 | Ferraiolo et al. | |
| 2013/0018624 A1 | 1/2013 | Bhatnagar et al. | |
| 2013/0073231 A1 | 3/2013 | Stagi et al. | |
| 2013/0108065 A1 | 5/2013 | Mullins et al. | |
| 2014/0092381 A1 | 4/2014 | Chu et al. | |
| 2015/0256274 A1 | 9/2015 | Olgaard et al. | |
| 2016/0141822 A1 | 5/2016 | Hijazi et al. | |
| 2016/0233925 A1 | 8/2016 | Barajas Gonzalez et al. | |

OTHER PUBLICATIONS

Restriction Requirement from U.S. Appl. No. 14/620,105, dated Feb. 24, 2016.
Non-Final Office Action from U.S. Appl. No. 14/620,105, dated May 17, 2016.
Ex Parte Quayle from U.S. Appl. No. 14/620,105, filed Dec. 2, 2016.
Notice of Allowance from U.S. Appl. No. 14/620,105, dated May 12, 2017.
List of IBM Patents or Patent Applications Treated as Related.

* cited by examiner

PARALLEL TESTING OF A CONTROLLER AREA NETWORK BUS CABLE

BACKGROUND

The present invention relates to data storage systems, and more particularly, this invention relates to testing of a controller area network (CAN) bus cable.

Automated data storage libraries are known for providing cost effective storage and retrieval of large quantities of data. The data in automated data storage libraries is typically stored on media of data storage cartridges that are, in turn, stored at storage slots or the like inside the library in a fashion that renders the media, and its resident data, accessible for physical retrieval. Such data storage cartridges are commonly termed "removable media." Data storage cartridge media may comprise any type of media on which data may be stored and which may serve as removable media, including but not limited to magnetic media (such as magnetic tape or disks), optical media (such as optical tape or disks), electronic media (such as PROM, EEPROM, flash PROM, CompactFlash™, Smartmedia™, Memory Stick™, etc.), or other suitable media. An example of a data storage cartridge that is widely employed in automated data storage libraries for mass data storage is a magnetic tape cartridge.

In addition to data storage media, automated data storage libraries typically comprise data storage drives that store data to, and/or retrieve data from, the data storage cartridge media. Further, automated data storage libraries typically comprise I/O stations at which data storage cartridges are supplied or added to, or removed from, the library. The transport of data storage cartridges between data storage slots, data storage drives, and I/O stations is typically accomplished by one or more accessors. Such accessors have grippers for physically retrieving the selected data storage cartridges from the storage slots within the automated data storage library and transporting such cartridges to the data storage drives by moving, for example, in the X and Y directions.

In an effort to increase storage capacity, deep slot technology allows for storage cells that contain more than a single data storage cartridge. Such storage libraries allow for higher density, or more cartridges stored per square foot. In 'deep slot' libraries, two or more cartridges may be stored in a multi-cartridge deep slot cell, arrayed in series, one behind the other, in tiers ranging from a frontmost tier to a rearmost tier.

BRIEF SUMMARY

A computer program product according to one embodiment includes a computer readable storage medium having program instructions embodied therewith, wherein the computer readable storage medium is not a transitory signal per se, the program instructions executable by a processing system to cause the processing system to perform a method that includes sending a data testing signal through a data lead of a cable via a first interface, sending a power signal through a power lead of the cable via the first interface, receiving and analyzing the data testing signal from the data lead of the cable via a second interface, and receiving and analyzing the power signal passing through the power lead of the cable via the second interface.

A system, according to one embodiment, includes a control circuit coupled to a first interface for coupling to a cable, a robotic accessor coupled to a second interface for coupling to the cable, a first portion of a testing system coupled to the control circuit and a second portion of the testing system on the robotic accessor. The robotic accessor is configured to transport data storage media from a storage slot and/or slot cell to a drive. The first portion is configured to send a data testing signal through a data lead of the cable via the first interface, and is configured to send a power signal through a power lead of the cable via the first interface. The second portion is configured to receive and analyze the data testing signal from the data lead of the cable via the second interface, and is configured to receive and analyze the power signal passing through the power lead of the cable via the second interface.

A computer-implemented method according to one embodiment includes receiving and analyzing a data testing signal from a data lead of a cable via an interface, and receiving and analyzing a power signal passing through a power lead of the cable via the interface. The receiving and analyzing the data testing signal is performed concurrently with the receiving and analyzing the power signal.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

DETAILED DESCRIPTION

Figure 1:
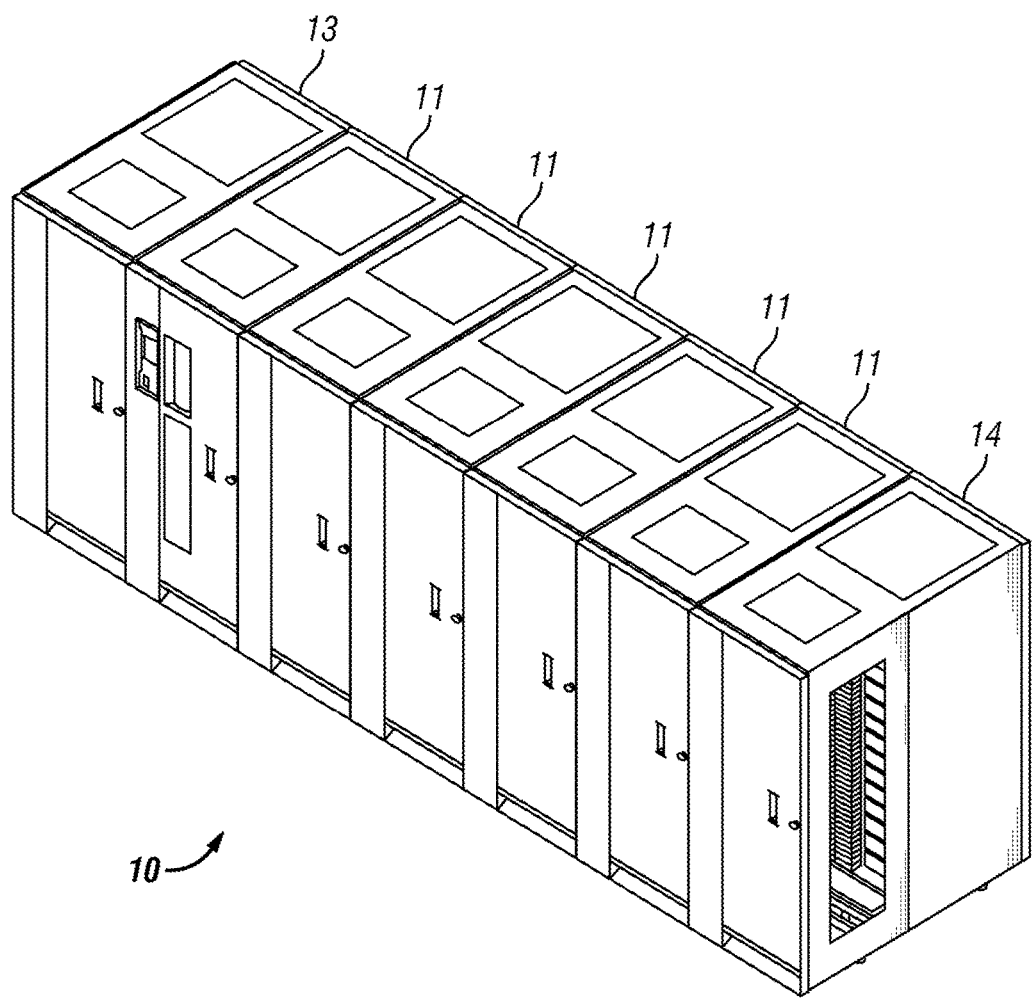
FIG. 1 is a perspective view of an automated data storage library according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of magnetic storage systems, as well as operation and/or component parts thereof.

In one general embodiment, a system includes a first portion having a first interface configured for coupling to a cable and a second portion having a second interface configured for coupling to the cable. The first portion has circuitry configured to send a data testing signal through a data lead of the cable via the first interface, and circuitry configured to send a power signal through a power lead of the cable via the first interface. The second portion has circuitry configured to receive and analyze the data testing signal from the data lead of the cable via the second interface, and has circuitry configured to receive and analyze the power signal through the power lead of the cable via the second interface.

In another general embodiment, a system includes a control circuit coupled to a first interface for coupling to a cable, a robotic accessor coupled to a second interface for coupling to the cable, a first portion of a testing system coupled to the control circuit and a second portion of the testing system on the robotic accessor. The robotic accessor is configured to transport data storage media from a storage slot and/or slot cell to a drive. The first portion is configured to send a data testing signal through a data lead of the cable via the first interface, and is configured to send a power signal through a power lead of the cable via the first interface. The second portion is configured to receive and analyze the data testing signal from the data lead of the cable via the second interface, and is configured to receive and analyze the power signal passing through the power lead of the cable via the second interface.

In another general embodiment, a method includes sending a data testing signal through a data lead of a cable via a first interface, sending a power signal through a power lead of the cable via the first interface, receiving and analyzing the data testing signal from the data lead of the cable via a second interface, and receiving and analyzing the power signal passing through the power lead of the cable via the second interface.

Figure 2:
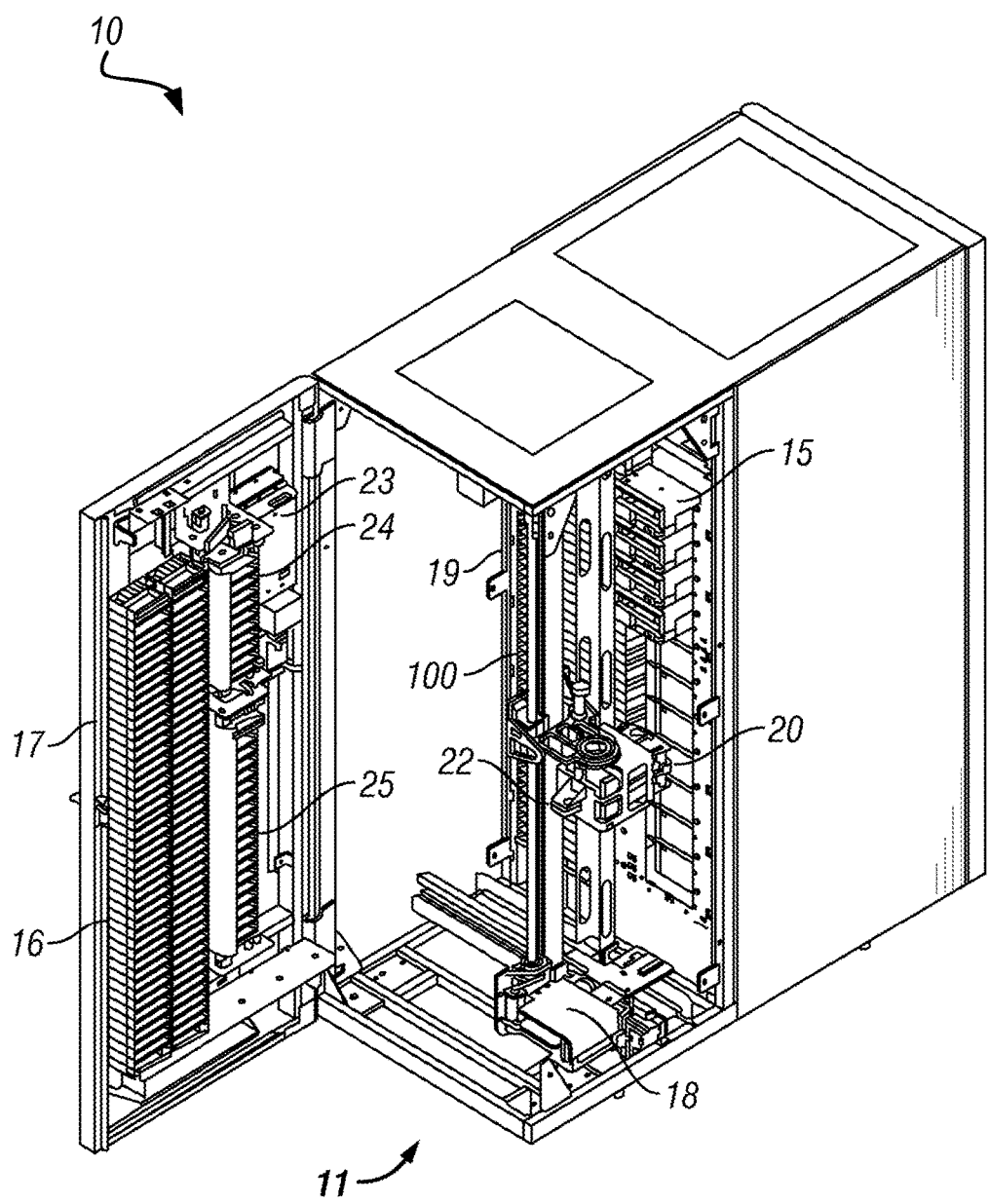
FIG. 2 is a perspective view of a storage frame from the data storage library of FIG. 1.

FIGS. 1-2 illustrate an automated data storage library 10 which stores and retrieves data storage cartridges, containing data storage media (not shown), from multi-cartridge deep slot cells 100 and single cartridge storage slots 16. An example of an automated data storage library which has a similar configuration as that depicted in FIGS. 1-2, and may be implemented with some of the various approaches herein is the IBM 3584 UltraScalable Tape Library. Moreover, it should be noted that references to "data storage media" herein refer to data storage cartridges, and for purposes of the present application, the two terms may be used synonymously.

The library 10 of FIG. 1 comprises a left hand service bay 13, one or more storage frames 11, and right hand service bay 14. As will be discussed in further detail below, a frame may comprise an expansion component of the library. Thus, storage frames may be added or removed to expand or reduce the size and/or functionality of the library. According to different approaches, frames may include additional storage slots, deep slot cells, drives, import/export stations, accessors, operator panels, etc.

FIG. 2 shows an exemplary embodiment of a storage frame 11, which acts as the base frame of the library 10. Moreover, the storage frame 11 illustrated in FIG. 2 is contemplated to be a minimum configuration of the library 10, for which there is only a single accessor 18 (i.e., there are no redundant accessors) and no service bay. However, in other embodiments, a storage frame may include multiple robotic accessors and/or service bays.

Looking to FIG. 2, the library 10 is arranged for accessing data storage media in response to commands from at least one external host system (not shown). The library 10 includes a plurality of storage slots 16 on front wall 17 and a plurality of multi-cartridge deep slot cells 100 on rear wall 19, both of which may be used to storing data storage cartridges that may contain data storage media. According to one approach, the storage slots 16 are configured to store a single data storage cartridge, and the multi-cartridge deep slot cells 100 are configured to store a plurality of data storage cartridges. In a preferred approach, the multi-cartridge deep slot cells may be arranged in sequential order of tiers from front to rear (e.g., see FIG. 7A).

With continued reference to FIG. 2, the storage frame 11 of the library 10 also includes at least one data storage drive 15, e.g., for reading and/or writing data with respect to the data storage media. Additionally, a first accessor 18 may be used to transport data storage media between the plurality of storage slots 16, the multi-cartridge deep slot cells, and/or the data storage drive(s) 15. According to various approaches, the data storage drives 15 may be optical disk drives, magnetic tape drives, or other types of data storage drives as are used to read and/or write data with respect to the data storage media.

As illustrated, the storage frame 11 may optionally include an operator panel 23 or other user interface, such as a web-based interface, which allows a user to interact with the library 10. The storage frame 11 may also optionally comprise an upper I/O station 24 and/or a lower I/O station 25, thereby allowing data storage cartridges to be added (e.g., inserted) to the library inventory and/or removed from the library without disrupting library operation. Furthermore, the library 10 may have one or more storage frames 11, each having storage slots 16, preferably accessible by the first accessor 18.

As described above, the storage frames 11 may be configured with different components depending upon the intended function. One configuration of storage frame 11 may comprise storage slots 16 and/or multi-cartridge deep slot cells 100, data storage drive(s) 15, and other optional components to store and retrieve data from the data storage cartridges. However, in another approach, a storage frame 11 may include storage slots 16 and/or multi-cartridge deep slot cells 100 and no other components. The first accessor 18 may have a gripper assembly 20, e.g., for gripping one or more data storage media, in addition to having a bar code scanner 22 or other reading system, such as a cartridge memory reader or similar system mounted on the gripper assembly 20, to "read" identifying information about the data storage media.

Figure 3:
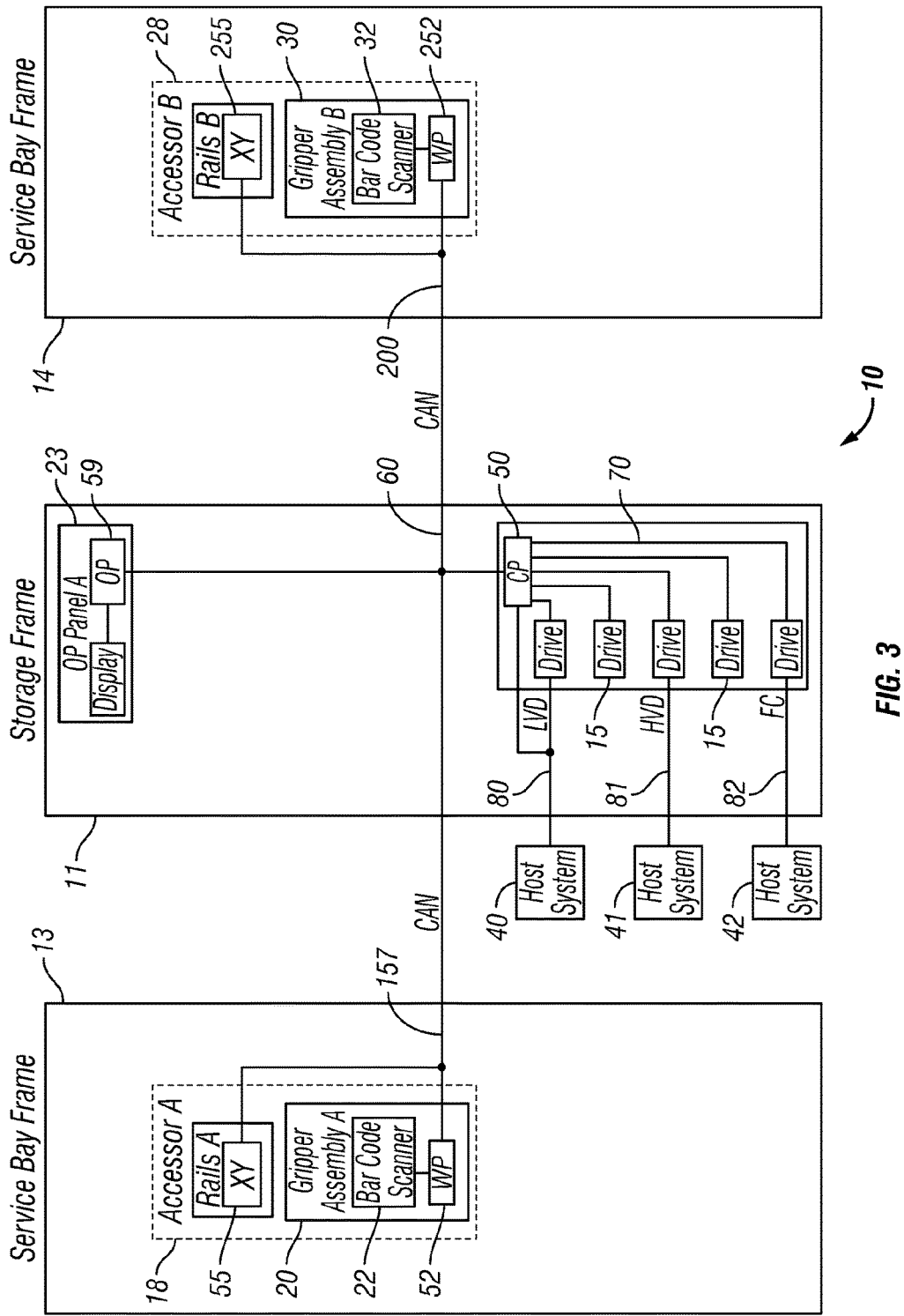
FIG. 3 is a block diagram of an automated data storage library according to one embodiment.

FIG. 3 depicts an automated data storage library 10, in accordance with one embodiment. As an option, the present automated data storage library 10 may be implemented in conjunction with features from any other embodiment listed herein, such as those described with reference to the other FIGS. Of course, however, such automated data storage library 10 and others presented herein may be used in various applications and/or in permutations which may or may not be specifically described in the illustrative embodiments listed herein. Further, the automated data storage library 10 presented herein may be used in any desired environment. Thus FIG. 3 (and the other FIGS.) should be deemed to include any and all possible permutations Referring now to FIG. 3, the automated data storage library 10 as described in reference to FIGS. 1 and 2, is depicted according to one embodiment. According to a preferred approach, the library 10 may employ a controller, e.g., arranged as a distributed system of modules with a plurality of processor nodes.

In one approach, the library is controlled, not by a central controller, but rather, by a distributed control system for receiving logical commands and converting the commands to physical movements of the accessor and gripper, and for operating the drives in accordance with the desired physical movements. The distributed control system may also provide logistical support, such as responding to host requests for element status, inventory, library status, etc. The specific commands, the conversion of those commands to physical movements, and the operation of the drives may be of a type known to those of skill in the art.

While the automated data storage library 10 has been described as employing a distributed control system, various other approaches described and/or suggested herein may be implemented in automated data storage libraries regardless of control configuration, such as, but not limited to, an automated data storage library having one or more library controllers that are not distributed.

Referring still to FIG. 3, the library 10 may have one or more storage frames 11, a left hand service bay 13 and a right hand service bay 14. The left hand service bay 13 is shown with a first accessor 18, where, as discussed above, the first accessor 18 may include a gripper assembly 20 and/or a reading system 22 to "read" identifying information about the data storage media depending on the desired embodiment. Furthermore, the right hand service bay 14 is shown having a second accessor 28, which includes a gripper assembly 30 and may also include a reading system 32 to "read" identifying information about the data storage media.

According to one approach, in the event of a failure or other unavailability of the first accessor 18, or its gripper assembly 20, etc., the second accessor 28 may perform some or all of the functions of the first accessor 18. Thus in different approaches, the two accessors 18, 28 may share one or more mechanical paths, they may have completely independent mechanical paths, or combinations thereof. In one example, the accessors 18, 28 may have a common horizontal rail with independent vertical rails to travel therealong. Moreover, it should be noted that the first and second accessors 18, 28 are described as first and second for descriptive purposes only and this description is not meant to limit either accessor to an association with either the left hand service bay 13, or the right hand service bay 14.

In an exemplary embodiment which is in no way intended to limit the invention, the first and second accessors 18, 28 may preferably move their grippers in at least two directions, called the horizontal "X" direction and vertical "Y" direction, e.g., to retrieve and grip, deliver and release, load and unload, etc. the data storage cartridge at the storage slots 16, multi-cartridge deep slot cells 100, data storage drives 15, etc.

With continued reference to FIG. 3, library 10 receives commands from one or more host systems 40, 41, 42. The host systems 40, 41, 42, such as host servers, communicate with the library directly, e.g., on path 80, through one or more control ports (not shown), or through one or more data storage drives 15 on paths 81, 82. Thus, in different approaches, the host systems 40, 41, 42 may provide commands to access particular data storage cartridges and move the cartridges, for example, between the storage slots 16 and the data storage drives 15. The commands are typically logical commands identifying the cartridges or cartridge media, and/or logical locations for accessing the media. Furthermore, it should be noted that the terms "commands" and "work requests" are used interchangeably herein to refer to such communications from the host system 40, 41, 42 to the library 10 as are intended to result in accessing particular data storage media within the library 10 depending on the desired approach.

According to one embodiment, the library 10 may be controlled by a library controller. Moreover, in various approaches, the library controller may include a distributed control system receiving the logical commands from hosts, determining the required actions, and/or converting the actions to physical movements of the first and/or second accessor 18, 28. In another approach, the distributed control system may have a plurality of processor nodes, each having one or more computer processors. According to one example of a distributed control system, a communication processor node 50 may be located in a storage frame 11. The communication processor node provides a communication link for receiving the host commands, either directly or through the drives 15, via at least one external interface, e.g., coupled to line 80.

Still referring to FIG. 3, the communication processor node 50 may additionally provide a communication link 70 for communicating with the data storage drives 15. As illustrated, the communication processor node 50 may preferably be located in the storage frame 11, e.g., close to the data storage drives 15. Furthermore, one or more additional work processor nodes may be provided to form an exemplary distributed processor system, which may comprise, e.g., a work processor node 52 located at first accessor 18, and that is coupled to the communication processor node 50 via a network 60, 157. According to different approaches, each work processor node may respond to received commands that are broadcast thereto from any communication processor node, and the work processor nodes may also direct the operation of the accessors, e.g., providing move commands. An XY processor node 55 may be provided and may be located at an XY system of first accessor 18. As illustrated, the XY processor node 55 is coupled to the network 60, 157, and is responsive to the move commands, operating the XY system to position the gripper assembly 20.

Also, an operator panel processor node 59 may be provided at the optional operator panel 23 for providing an interface for communicating between the operator panel and the communication processor node 50, the work processor nodes 52, 252, and the XY processor nodes 55, 255.

A network 60, for example comprising a common bus, is provided, coupling the various processor nodes. The network may comprise a robust wiring network, such as the commercially available CAN bus system, which is a multi-drop network, having a standard access protocol and wiring standards, for example, as defined by CiA, the CAN in Automation Association, Am Weich Selgarten 26, D-91058 Erlangen, Germany. Other networks, such as Ethernet, or a wireless network system, such as RF or infrared, may be employed in the library as is known to those of skill in the art. In addition, multiple independent networks may also be used to couple the various processor nodes.

As illustrated in FIG. 3, the communication processor node 50 is coupled to each of the data storage drives 15 of a storage frame 11, via lines 70, and are thereby communicating with the drives 15 and with host systems 40, 41, 42. Alternatively, the host systems 40, 41, 42 may be directly coupled to the communication processor node 50, at input 80 for example, or to control port devices (not shown) which connect the library to the host system(s) with a library interface similar to the drive/library interface. As is known to those of skill in the art, various communication arrangements may be employed for communication with the hosts and with the data storage drives. In the example of FIG. 3, host connections 80 and 81 are intended to be SCSI busses. However, bus 82 comprises an example of a Fibre Channel bus which is a high speed serial data interface, allowing transmission over greater distances than the SCSI bus systems.

According to some approaches, the data storage drives 15 may be in close proximity to the communication processor node 50, and may employ a short distance communication scheme, such as SCSI, or a serial connection, such as RS-422. Thus the data storage drives 15 may be individually coupled to the communication processor node 50 by lines 70. Alternatively, the data storage drives 15 may be coupled to the communication processor node 50 through one or more networks, such as a common bus network.

Furthermore, additional storage frames 11 may be provided, whereby each is preferably coupled to the adjacent storage frame. According to various approaches, any of the additional storage frames 11 may include communication processor nodes 50, storage slots 16, data storage drives 15, networks 60, etc.

Moreover, as described above, the automated data storage library 10 may comprise a plurality of accessors. A second accessor 28, for example, is shown in a right hand service bay 14 of FIG. 3. The second accessor 28 may include a gripper assembly 30 for accessing the data storage media, and an XY system 255 for moving the second accessor 28. The second accessor 28 may run on the same horizontal mechanical path as the first accessor 18, and/or on an adjacent (e.g., separate) path. Moreover the illustrative control system additionally includes an extension network 200 which forms a network coupled to network 60 of the storage frame(s) 11 and to network 157 of left hand service bay 13.

In FIG. 3 and the accompanying description, the first and second accessors are associated with the left hand service bay 13 and the right hand service bay 14 respectively. However, this is for illustrative purposes and there may not be an actual association. Thus, according to another approach, network 157 may not be associated with the left hand service bay 13 and network 200 may not be associated with the right hand service bay 14. Moreover, depending on the design of the library, it may not be necessary to have a left hand service bay 13 and/or a right hand service bay 14 at all.

An automated data storage library 10 typically comprises one or more controllers to direct the operation of the automated data storage library. Moreover, host computers and data storage drives typically include similar controllers. A library controller may take many different forms and may comprise, for example, but is not limited to, an embedded system, a distributed control system, a personal computer, a workstation, etc. The term "library controller" as used herein is intended in its broadest sense as a device that includes at least one processor, and optionally further circuitry and/or logic, for controlling and/or providing at least some aspects of library operations.

Figure 4:
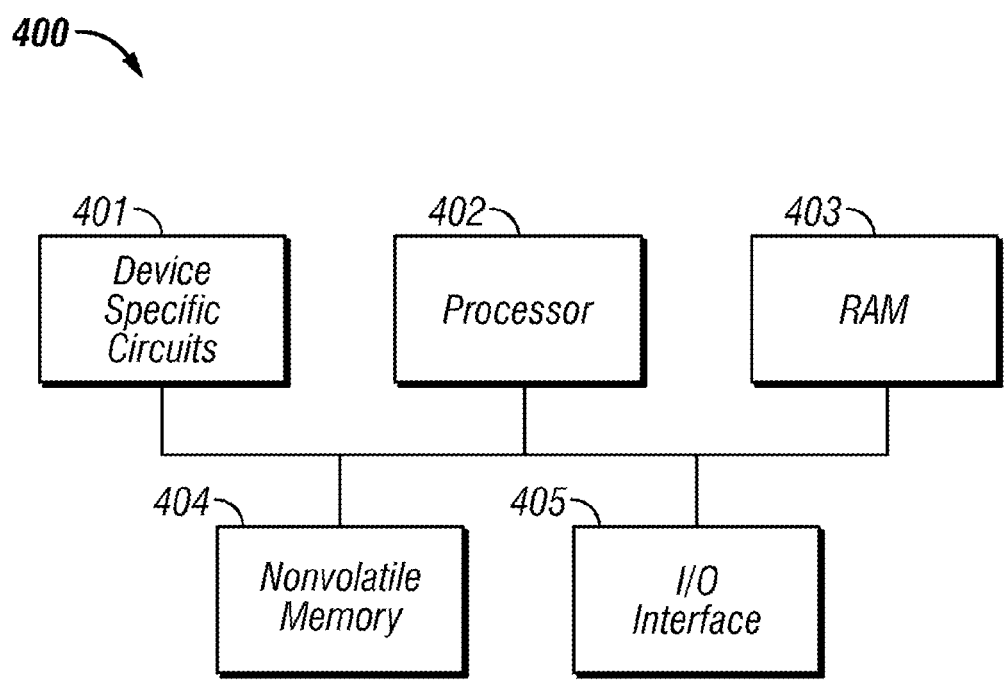
FIG. 4 is a block diagram depicting a controller configuration according to one embodiment.

Referring now to FIG. 4, a typical controller 400 is shown with a processor 402, Random Access Memory (RAM) 403, nonvolatile memory 404, device specific circuits 401, and I/O interface 405. Alternatively, the RAM 403 and/or nonvolatile memory 404 may be contained in the processor 402 as could the device specific circuits 401 and I/O interface 405. The processor 402 may comprise, for example, an off-the-shelf microprocessor, custom processor, Field Programmable Gate Array (FPGA), Application Specific Integrated Circuit (ASIC), discrete logic, etc. The RAM 403 is typically used to hold variable data, stack data, executable instructions, etc.

According to various approaches, the nonvolatile memory 404 may comprise any type of nonvolatile memory such as, but not limited to, Electrically Erasable Programmable Read Only Memory (EEPROM), flash Programmable Read Only Memory (PROM), battery backup RAM, hard disk drives, etc. However, the nonvolatile memory 404 is typically used to hold the executable firmware and any nonvolatile data. Moreover, the I/O interface 405 comprises a communication interface that allows the processor 402 to communicate with devices external to the controller. Examples may comprise, but are not limited to, serial interfaces such as RS-232, USB (Universal Serial Bus) or Small Computer Systems Interface (SCSI). The device specific circuits 401 provide additional hardware to enable the controller 400 to perform unique functions including, but not limited to, motor control of a cartridge gripper. Moreover, the device specific circuits 401 may include electronics that provide, by way of example but not limitation, Pulse Width Modulation (PWM) control, Analog to Digital Conversion (ADC), Digital to Analog Conversion (DAC), etc. In addition, all or part of the device specific circuits 401 may reside outside the controller 400.

While the automated data storage library 10 is described as employing a distributed control system, the various approaches described and/or suggested herein may be implemented in various automated data storage libraries regardless of control configuration, including, but not limited to, an automated data storage library having one or more library controllers that are not distributed. Moreover, a library controller may comprise one or more dedicated controllers of a library, depending on the desired embodiment. For example, there may be a primary controller and a backup controller. In addition, a library controller may comprise one or more processor nodes of a distributed control system. According to one example, communication processor node 50 (e.g., of FIG. 3) may comprise the library controller while the other processor nodes (if present) may assist the library controller and/or may provide backup or redundant functionality. In another example, communication processor node 50 and work processor node 52 may work cooperatively to form the library controller while the other processor nodes (if present) may assist the library controller and/or may provide backup or redundant functionality. Still further, all of the processor nodes may comprise the library controller. According to various approaches described and/or suggested herein, a library controller may have a single processor or controller, or it may include multiple processors or controllers.

With continued reference to the above described storage environments, it should be noted that tape library components sometimes experience power failures and/or contribute to data losses. These power failures and/or data losses are often due to the fact that mobile library robots, which may perform up to 10,000 tape drive relocations a day, experience e.g. wear, stretching, damage, etc., to their CAN bus cables (which may include power cables, data cables, etc.). Damage to CAN bus cables is often due to the CAN bus cables dragging behind the robots on vertical and horizontal stretches across the tape library in order to maintain a connection between the robots and processing sources, power sources, testing sources, etc.

When CAN bus cable(s) are damaged, robot commands along with the voltage and current required to power the robot motors may remain undelivered, and thus a tape library may experience data loss and or voltage/current loss. This is problematic and often leads to e.g. a loss of library functionality, customer environment downtime, data packet losses, etc.

While each of the assorted cables of a CAN bus cable may be tested individually, individual cable troubleshooting may be time consuming and may require expensive service personnel. It may also cause the customer to be offline for long periods of time. Furthermore, the costly parts being replaced may still be functional. Additionally, a properly performing robot is hard to define, for example: while one cable replacement may fix communication among two nodes, it may not serve as a fix for communication among all the nodes.

Various embodiments herein detail systems and methodology for on-site parallel functionality testing capabilities of cables. Such systems may be used to test any type of cable, such as CAN bus cables, controller cables, robotics cables e.g., in a manufacturing context, etc. By way of example only, and merely to place the present description in a context, much of the following description describes embodiments for testing storage environment CAN bus cables. Again, this is done by way of example only, and should not be deemed limiting.

Figure 5:
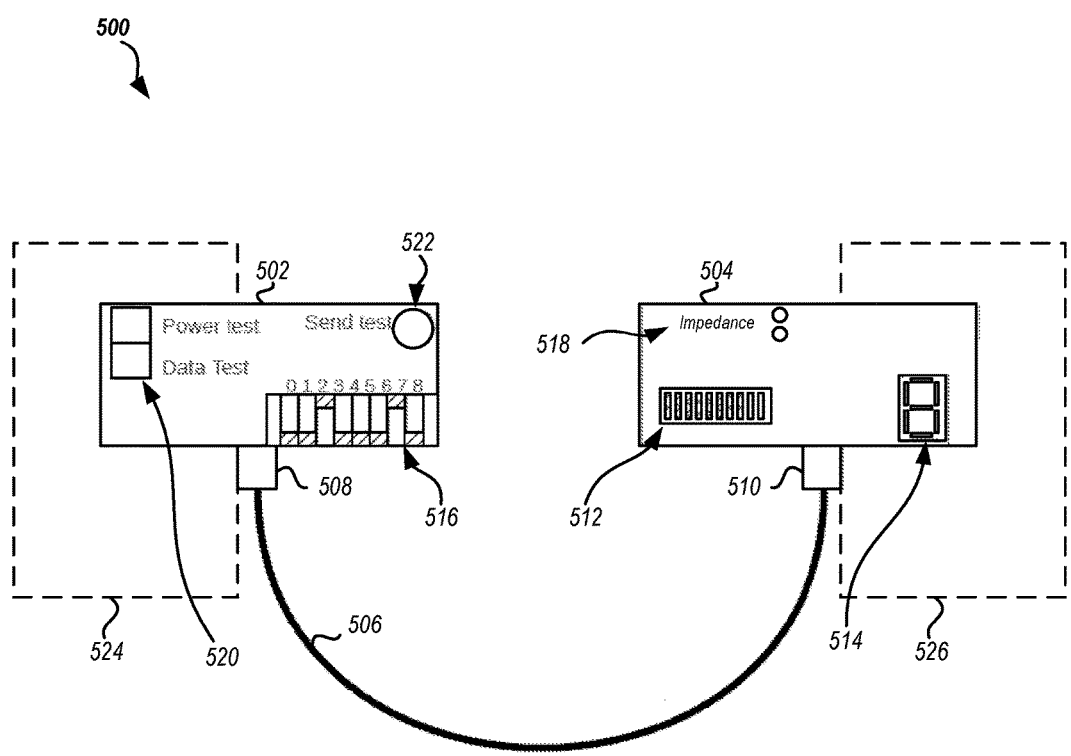
FIG. 5 illustrates a system for on-site testing of CAN bus cables in accordance with one embodiment.

FIG. 5 depicts a system 500 for on-site testing of cables, in accordance with one embodiment. As an option, the present system 500 may be implemented in conjunction with features from any other embodiment listed herein, such as those described with reference to the other FIGS. Of course, however, such system 500 and others presented herein may be used in various applications and/or in permutations which may or may not be specifically described in the illustrative embodiments listed herein. Further, the system 500 presented herein may be used in any desired environment.

Referring now to FIG. 5, system 500 includes a first portion 502 having a first interface 508 configured for direct or indirect (operative) coupling to a cable 506 (such as a CAN bus cable). System 500 also includes a second portion 504 having a second interface 510 configured for direct or indirect (operative) coupling to cable 506. The first and/or second interface may be any suitable known type of interface, such as for example, a cable adapter (e.g., receptacle), a bus, an interface for insertion in a slot of a control board, a cable for coupling to a receptacle to which the cable can be coupled, etc. Cable 506 is shown connected to both the first portion 502 and the second portion 504, and may or may not be considered part of the system 500.

It should be noted that the cable connectivity of system 500 may be a closed circuit model, with both ends of the circuit routed to the system 500 (as shown in FIG. 5). Furthermore, the circuitry of cable 506, e.g. data cable configurations, power cable configurations, number of data and/or power cables, etc. may vary depending on the preferred embodiment.

Figure 6:
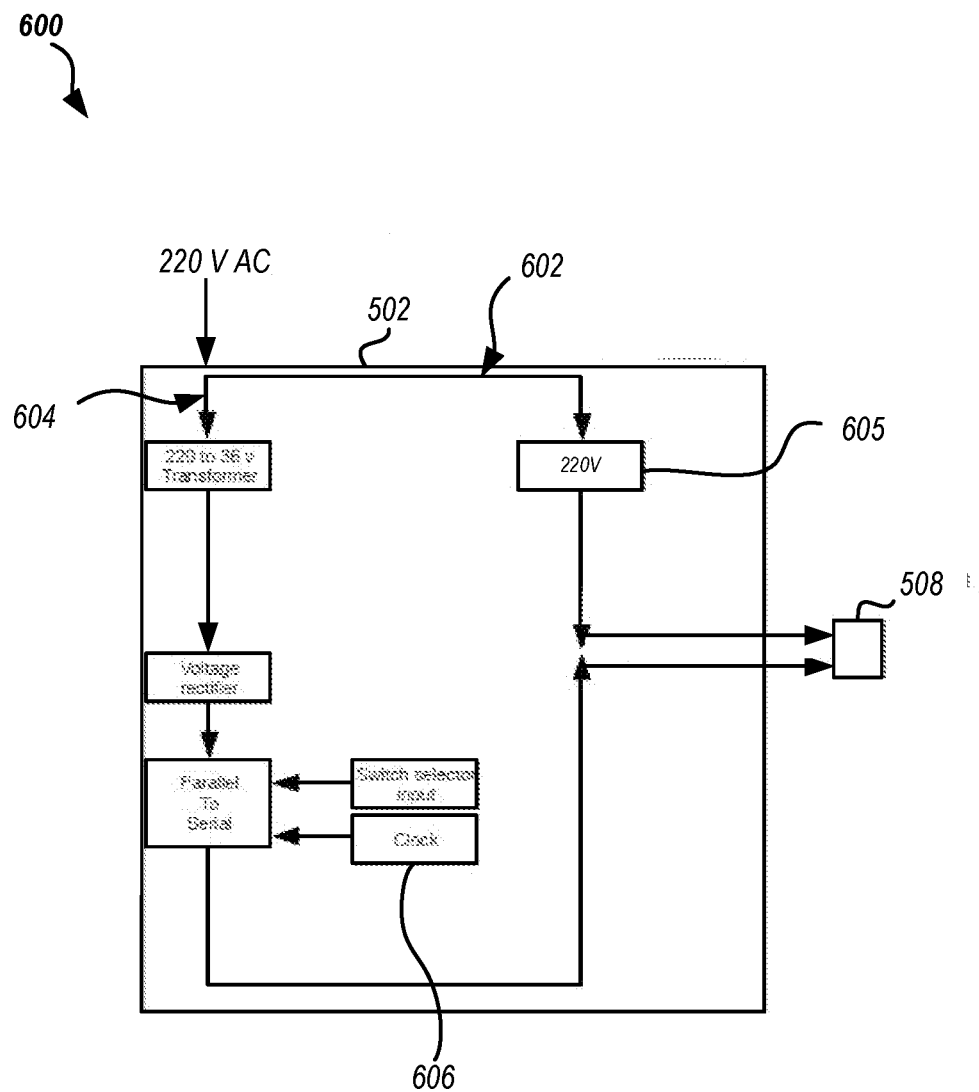
FIG. 6 illustrates a circuit diagram in accordance with one embodiment.

The first portion 502 has circuitry configured to send a data testing signal through a data lead of the cable 506 via the first interface 508. The first portion 502 additionally has circuitry configured to send a power signal through a power lead of the cable 506 via the first interface 508. In a preferred embodiment, the power signal mimics the power signal in terms of voltage and/or current sent through the cable in operation, e.g., the power signal sent through a CAN bus cable to a robotic accessor during library operations. FIG. 6, which illustrates an illustrative circuit layout 600 of the first portion 502, is described below.

Figure 7:
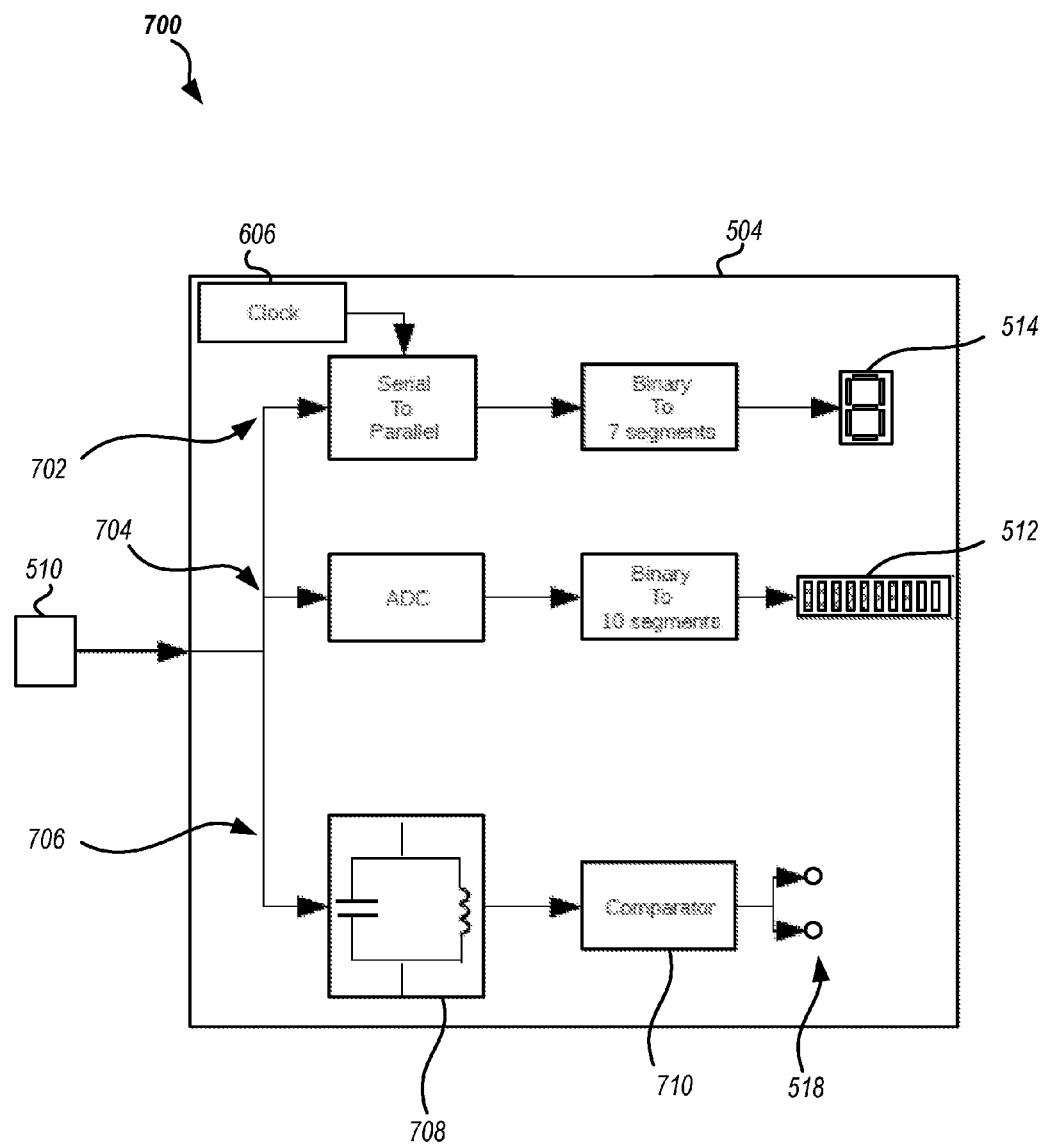
FIG. 7 illustrates a circuit diagram in accordance with one embodiment.

With continued reference to FIG. 5, the second portion 504 has circuitry configured to receive and analyze the data testing signal from the data lead of the cable 506 via the second interface 510. The second portion 504 also has circuitry configured to receive and analyze the current through the power lead of the cable 506 via the second interface 510. Data testing signals and electrical test currents described herein may be sent from the first portion 502 and e.g. received, analyzed, etc., by the second portion 504 in order to test for, e.g., power failures, data losses, faulty cables, etc., of a storage environment (e.g. storage libraries such as that shown in FIGS. 1-2). Power failures, data losses, faulty cables, etc., of the storage environment may potentially be caused by the wear, stretching, damage, etc., of the cable in a storage environment. FIG. 7, which illustrates an illustrative circuit layout 700 of the second portion 504, is described below.

Referring again to FIG. 5, it should be noted that the first portion 502 may be configured to send the data testing signal and the power signal concurrently. The second portion 502 may furthermore be configured to analyze the received data testing signal and the received power signal concurrently. Sending and then testing the data testing signal and the power signal concurrently may be advantageous especially in terms of being able to quickly test the functionality of a storage environment, minimize customer environment downtime, quickly locate a damaged and/or faulty CAN bus cable, diagnose problems such as shorting that occur as a result of concurrent power and data transfer during normal operations, etc. Moreover, sending and then testing the data testing signal and the power signal concurrently allows for simulated effects of the power, e.g., current and/or voltage, on the data signal, such as crosstalk, etc. Embodiments of testing a storage environment cable (e.g. cable 506 of system 500) via circuitry will now be described below.

FIG. 6 illustrates a circuit layout 600 of the first portion 502. Electrical currents described herein may be sent from the first portion 502 by following logic path 602 of circuit layout 600. Storage environment may be powered by numerous varying operating voltages and currents, any of which may be used in different embodiments. For exemplary purposes, 220 Volts-alternating current (hereafter "V AC") is shown entering the circuitry of circuit layout 600 of the first portion 502.

Data testing signals described herein may also be prepared and/or sent from the first portion 502 to the second portion 504 by following logic path 604 of circuit layout 600. As shown by logic path 604, the exemplary 220 V AC current may be stepped down e.g. to an exemplary 36 V AC via one or more transformers and/or a voltage regulator during testing. As illustrated in FIG. 6, the current used for data signal integrity testing, e.g. exemplary 36 V AC current of logic path 604, may be converted to a DC current via a voltage rectifier.

As further illustrated in FIG. 6, the parallel data stream being used for data testing may be converted to a serialized data stream by a parallel to serial data converter for transmission purposes across the cable 506. A switch selector input and clock 606 may also be input into a parallel to serial data converter for timing and selection purposes of the data stream. For example, the switch selector input may allow selection of the proper parallel to serial conversion for the cable to be tested. The serialized data stream may be transmitted from the first portion 502 to the second portion 504 via cable 506 (represented in FIGS. 5 and 6 entering first interface 508 and being delivered to the second portion 504 at the second interface 510 in FIGS. 5 and 7).

The one or more electrical currents may be transmitted from the first portion 502 to the second portion 504 via cable 506 (represented in FIG. 5 entering first interface 508 and being delivered to the second portion 504 at the second interface 510 in FIG. 7). These electrical currents may then be tested to determine the functionality of the cable 506. Electrical current testing descriptions will now be described below.

FIG. 7 illustrates a circuit layout 700 of the second portion 504. Following logic path 706, the transmitted electrical current may pass through one or more AC circuits 708, in order to measure the impedance of the electrical current being transmitted across the cable 506. The measured impedance may be used to test for power failures, faulty cables, shorted cables etc., of the storage environment (e.g. circuit layout 600), as will be described below.

The second portion 504 may be configured to compare one or more aspects of the power received at the second portion 504 to that sent by the first portion 502. For example, a loss in current could indicate a short in the cable. A drop in voltage, e.g., as determined by comparing a voltage measured by a voltmeter 605 in the first portion (FIG. 5) and a voltage measured at the second portion, may indicate a problem with the cable. Outputs of other types of meters and/or detectors may be used to compare parameters of the sent and received power signal. For example, ammeters may be used to detect current loss.

In one approach using a comparator 710, the impedance of the power lead (measured across AC circuit 708), or derivative thereof, to a value e.g. a pre-defined value, a user defined value, a calculated value, etc., and output a result of the comparing to e.g. a list, to a controller, to an impedance display 518, etc. When the measured impedance is found to be above the pre-defined value, the cable 506 may be determined to be e.g. faulty, shorted, nicked, etc. and scheduled for replacement. Furthermore, one of the two lights of the impedance display 518 may be lit on second portion 504 interface, in order to alert the user of a cable needing repair and/or replacement due to power losses. When the measured impedance is found to be equal to or below the pre-defined value, the cable 506 may be determined to be functional/non-damaged. Furthermore, the remaining one of the two lights of the impedance display 518 may be lit, in order to alert the user of a sufficiently functioning cable.

To further ensure that the cable is functioning sufficiently, data sent to the second portion 504 by the first portion 502 (e.g. sent from the first portion 502 by following logic path 604 as described above) may be extracted from the received data testing signal. Extracting data from the received data testing signal may be performed using a methodology of a type known in the art. As illustrated in circuit layout 700 of the second portion 504, the analog serialized data stream may be converted into a digital data stream in logic path 704 via an analog to digital converter (ADC) of FIG. 7. Additionally, the serialized data stream may be converted into a parallel data stream in logic path 702 via a serial to parallel converter, e.g., deserializer. As further illustrated in logic path 702, internal components may use clock 606 in order to convert the serialized data stream into a parallel data stream.

According to logic path 702, the parallel data stream may be converted from a binary data stream into equivalent data segments and displayed for a user on the second portion 504 via a display. The user may determine the integrity of the extracted signal based on the output of this display. For example, as shown in FIG. 5, a transmitted binary segment 516 may be converted (once received and extracted by the second portion 504) into seven segment equivalent data blocks, as detailed in logic path 702 of FIG. 7. These seven segment equivalent data blocks may then be displayed by a byte received display 514 where receiving a binary value of one may be represented by a "1" being shown in display 514, a binary value of two may be represented by a "2" being illuminated in display 514, etc., so that a user may determine if the cable 506 (which the data testing signal was transmitted across) is in need of repair and/or replacement e.g. due to an incorrect binary value being delivered to the second portion 504, and displayed in display 514. Note that while display 514 is shown with a single digit output, various embodiments may include displays capable of displaying multiple digits. This sent/received data test may also be evaluated and/or performed by e.g. comparator logic, a comparison method of a type known in the art, etc.

Moreover, according to logic path 704, the now digital data stream may be converted from a binary data stream into equivalent data segments and displayed for a user (as detailed in logic path 704 of FIG. 7) on a display the second portion 504. The user may determine the quality of the extracted signal based on this display. For example, as shown in FIG. 5, the transmitted binary segment 516 may be converted (once received and extracted by the second portion 504) into ten segment equivalent data blocks. These ten segment equivalent data blocks may then be displayed by a quality of signal display 512 where a binary number one may be represented by only one bar of the display 512 being lit, a binary number two may be represented by two bars of the display 512 being lit, etc., so that a user may determine if the cable 506 is in need of repair and/or replacement e.g. when the incorrect number of bars of signal display 512 are lit.

Binary segment values and/or sizes used in testing the integrity and quality of a transmitted signal may vary depending on the preferred embodiment.

Moreover, rather than outputting information to a display, results of the data decoding and/or analysis may be output to another system, such as a computer system, for output and/or further computations.

Referring again to FIG. 5, the first portion 502 additionally has a testing display 520 which may illustrate to a user whether a power test, data test, or both are being performed. The first portion 502 and second portion 504 described herein may have additional and/or other displays (not shown), and may vary depending on the preferred embodiment. Furthermore, the first portion 502 has a send test interface button 522, for a user to initiate testing of a CAN bus cable, as described herein. Testing of a storage environment cable (e.g. cable 506) may further be initiated by trigger conditions, a controller, detection of a power loss and/or data loss, etc.

The second portion 504 may be additionally configured to compare data extracted from the received data testing signal to data sent by the first portion 502 in order to determine if a cable is in need of repair and/or replacement. Comparing data extracted from the received data testing signal to data sent by the first portion 502 may be performed by comparator circuitry e.g. a comparator, a signal quality recorder, a process of a type known in the art, etc. In one approach, the second portion 504 may have prestored thereon a copy of the data sent from the first portion 502 for use in the comparison. In another approach, the second portion may receive a copy of the data from the first portion via some mechanism, e.g., wireless connection, memory card, etc. In yet another approach, the same data sequence may be sent on a plurality of individual wires of the cable and compared to one another, where a non-matching sequence on one of the wires may indicate that the particular wire is faulty.

When it is determined from the comparison that the data extracted from the received data testing signal resembles data sent by the first portion 502, e.g. within a certain pre-set threshold of accuracy, etc., the cable 506 may be determined to be functional, not in need of repair and or replacement, not experiencing data losses, etc.

When it is determined from the comparison that the data extracted from the received data testing signal does not resemble the data sent by the first portion 502, e.g. within a certain pre-set threshold of accuracy, which may be 100% or less, the cable 506 may be determined to be not functioning according to design e.g. faulty, shorted, nicked, etc.

According to a further embodiment, the second portion 504 may be configured to determine both an integrity and a quality of the data testing signal.

When the determined integrity and/or quality of the data testing signal is determined to be outside of an acceptable integrity and/or quality range e.g. when compared to a pre-set acceptable integrity and/or quality level, etc., the cable 506 may be determined to be not functioning properly e.g. not according to design, faulty, shorted, nicked, etc., and may be scheduled for maintenance and/or replacement.

When the determined integrity and/or quality of the data testing signal is determined to be within an acceptable integrity and/or quality range e.g. when compared to a pre-set acceptable integrity and/or quality level, etc., the cable 506 may be determined to be functioning according to design, not faulty, not shorted, not nicked, etc.

The second portion 504 may also be configured to measure the voltage of the received signal, and compare it with the voltage of the signal sent by the first portion 502, in order to verify that there were no unfavorable voltage losses during transmission across cable 506 due to a faulty cable, shorted cable, etc.

It should be noted that when the serialized data stream is sent by the first portion 502 and not detected, delivered, etc. whatsoever by the second portion, the cable 506 may be determined to be damaged, non-functional, in need of repair and/or replacement, etc., depending on the embodiment.

It should also be noted that the first portion 502 and second portion 504 may be configured to perform data and/or power testing at least two times in sequence. Performing data and/or power tests at least two times in sequence may provide a more definite/reinforced test conclusion, and additionally may uncover data losses and/or power losses that were not detected on a first or subsequent testing iteration. Additionally, on site, multiple iteration testing of a storage environment may prove advantageous as it may not require disassembly and/or a professional diagnosis of the potentially non-functional/faulty components. This may be because multiple testing mechanisms, e.g. data testing, power testing, embodiments of testing described herein, etc., may be built into the storage environment.

Furthermore, data and/or power tests may be initially and/or subsequently performed after an operation that causes the cable 506 to shift, stretch, slacken, etc., in order to trigger a detectable data loss and/or power loss of a damaged cable that did not exhibit a detectable data loss and/or power loss throughout previous testing iterations. For example, a cable coupling a tape library robotic accessor to a controller may in fact be nicked but successfully transmit both data and power tests across the cable throughout a first test iteration. This cable may be then added to a watch list, and after waiting for the robotic accessor to move to a different location in the tape library, the cable coupling a tape library robotic accessor to a second interface may be e.g. stretched, shifted, slackened, etc., causing a detectable data loss and/or power loss (which may then be detected on the subsequent data and/or power tests).

In response to the cable successfully transmitting both the data and the power tests across the cable on a first or subsequent testing sequence, according to one embodiment, the cable may be determined to be functional/not damaged. Once this is determined, the functionality of other components of the storage environment, e.g. components of a first portion 502, components of a second portion 504, further components of e.g. a robot, etc. may be tested.

Referring again to FIG. 5, according to one embodiment, the first and or second interface 508, 510, may be coupled to a tape library system. The tape library system may include a control circuit 524, e.g., of a controller, for controlling operation of the tape library system. Additionally, the tape library system may include an accessor for accessing/moving tape cartridges within the tape library system e.g. a robotic accessor 526, etc.

A first portion 502 of the testing system may be coupled to the control circuit 524. The first portion may be configured to perform the functions described herein.

In one approach, a control circuit 524 may be coupled to the first interface 508 for coupling to the cable 506. According to one embodiment, the first interface 508 may include two plug receptacles. For example, one of the plug receptacles may enable a coupling between the first portion 502 and the cable 506 as described above. Additionally, the second plug receptacle may enable a coupling between the control circuit 524 and the cable 506.

According to yet a further embodiment, the first interface 508 may additionally include switching logic. The switching logic may provide selective coupling between the control circuit 524 and the first portion 502. The switching logic may be selectively alternated depending on e.g. a detected failure in the tape library system, a trigger condition, a programmed user preference, etc. Alternatively or additionally, the selective coupling between the control circuit 524 and the first portion 502 may be switched by another mechanism, e.g. a user physically unplugging a cable coupling between two components and plugging the cable in a different location to create a different coupling, etc.

In another embodiment, the second portion 504 of the testing system 500 may be coupled to the robotic accessor 526. The second portion 504 may be configured to perform the functions described herein.

In one approach, the robotic accessor 526 may be coupled to the second interface 510 for coupling to the cable 506. The robotic accessor may be configured to transport data storage media from a storage slot and/or slot cell to a drive, e.g. such as in the tape library system described herein, etc.

According to one embodiment, the second interface 510 may include two plug receptacles, e.g., as described above for an embodiment of the first interface 508. For example, one of the plug receptacles may provide a mechanism for coupling between the second interface 510 and the cable 506 as described above. Additionally, the second plug receptacle may provide a mechanism for coupling between the robotic accessor 526 and the cable 506.

According to yet a further embodiment, the second interface may additionally include switching logic. The switching logic may provide selective coupling between the robotic accessor 526 and the second portion 504. The switching logic may be selectively alternated depending on, e.g., a detected failure in the tape library system, a trigger condition, a programmed user preference, etc. Alternatively or additionally, the selective coupling between the robotic accessor 526 and the second portion 504 may be switched by another mechanism e.g. a user physically unplugging a cable coupling between two components and plugging the cable in a different location to create a different coupling, etc.

As illustrated by system 500, it should be noted that the first and second portions 502, 504 may be on separate devices. Such separate devices may be portable, coupled to a system that uses the cable 506 such as an automated data storage library, etc.

According to one embodiment, the first and second portions 502, 504 may be on a common substrate, mounted in a single apparatus, etc.

Furthermore, the first and second portions 502, 504 may be integrated with a system that uses the cable 506 such an automated data storage library.

A preferred method of testing the functionality of the cable 506 will now be described below.

Figure 8:
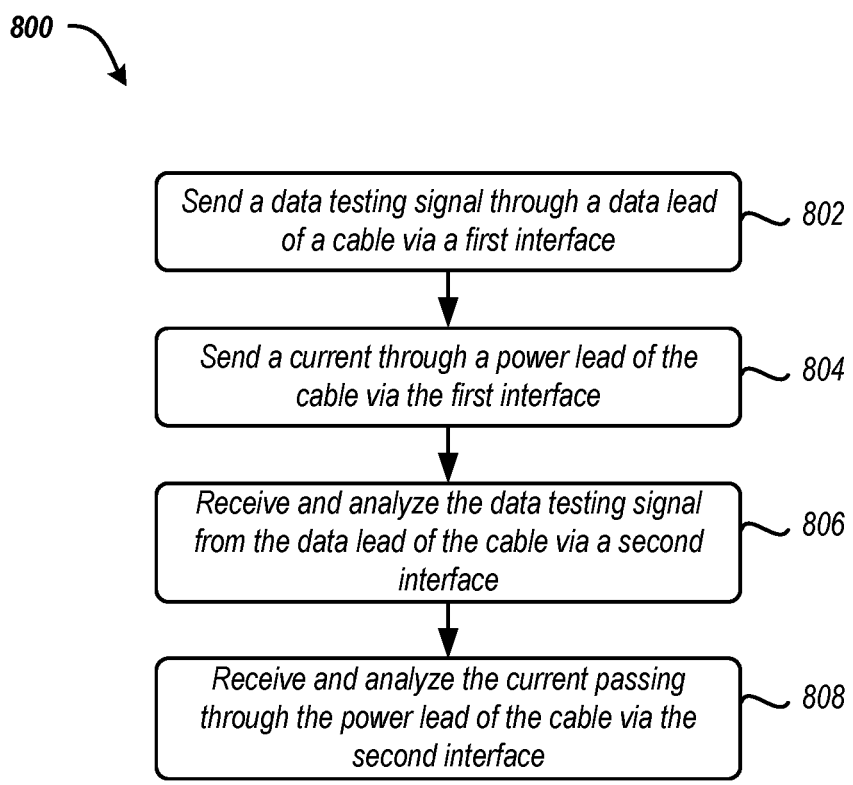
FIG. 8 illustrates a method in accordance with one embodiment.

Now referring to FIG. 8, a flowchart of a method 800 is shown according to one embodiment. The method 800 may be performed in accordance with the present invention in any of the environments depicted in FIGS. 1-7, among others, in various embodiments. Of course, more or fewer operations than those specifically described in FIG. 8 may be included in method 800, as would be understood by one of skill in the art upon reading the present descriptions.

Each of the steps of the method 800 may be performed by any suitable component of the operating environment. For example, in various embodiments, the method 800 may be partially or entirely performed by one or more processing apparatuses. The processing apparatus, e.g., processing circuit(s), chip(s), and/or module(s) implemented in hardware and/or software, and preferably having at least one hardware component may be utilized in any device to perform one or more steps of the method 800. Illustrative processors include, but are not limited to, a central processing unit (CPU), an ASIC, an FPGA, etc., combinations thereof, or any other suitable computing device known in the art.

It should be noted that the logic for performing the sending, receiving and/or analyzing operations (such as those described below, herein, etc.) may be integrated with a system that uses the cable as described herein, e.g., integrated with an automated data storage library.

In operation 802, a data testing signal is sent through a data lead of a cable via a first interface.

Furthermore, in operation 804, a current is sent through a power lead of the cable via the first interface. As previously described herein, the data testing signal and the power signal may be sent concurrently. In addition, the data testing signal and the power signal may be analyzed concurrently in order to simulate effects of the power current on the data signal.

In operation 806, the data testing signal from the data lead of the cable is received via a second interface and analyzed. As previously described herein, an integrity and/or a quality of the data testing signal may be determined.

In operation 808, the current passing through the power lead of the cable is received via the second interface and analyzed.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a CPU, an integrated circuit (IC), a graphics processing unit (GPU), etc.

A data processing system suitable for storing and/or executing program code may include at least one processor, which may be or be part of a controller, coupled directly or indirectly to memory elements through a system bus, such as processor 400 of FIG. 4. The memory elements can include local memory employed during actual execution of the program code, such as nonvolatile memory 404 of FIG. 4, bulk storage, and cache memories which provide temporary storage of at least some program code in order to reduce the number of times code must be retrieved from bulk storage during execution.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A computer program product, the computer program product comprising a computer readable storage medium having program instructions embodied therewith, wherein the computer readable storage medium is not a transitory signal per se, the program instructions executable by a processing system to cause the processing system to perform a method comprising:
    sending, by the processing system, a data testing signal through a data lead of a cable via a first interface;
    sending, by the processing system, a power signal through a power lead of the cable via the first interface;
    receiving and analyzing, by the processing system, the data testing signal from the data lead of the cable via a second interface; and
    receiving and analyzing, by the processing system, the power signal passing through the power lead of the cable via the second interface.

2. The computer program product as recited in claim 1, wherein the data testing signal and the power signal are sent concurrently.

3. The computer program product as recited in claim 1, wherein both an integrity and a quality of the data testing signal is determined.

4. The computer program product as recited in claim 1, wherein the processing system is integrated with a second system that uses the cable.

5. The computer program product as recited in claim 4, wherein the second system is an automated tape storage library.

6. The computer program product as recited in claim 1, wherein a voltage of the data testing signal is less than a voltage of the power signal.

7. The computer program product as recited in claim 1, wherein the data testing signal is an alternating current (AC) data testing signal.

8. The computer program product as recited in claim 1, wherein the power signal is an alternating current (AC) power signal.

9. The computer program product as recited in claim 1, wherein the data testing signal is an alternating current (AC) data testing signal and the power signal is an AC power signal.

10. A system, comprising:
a control circuit coupled to a first interface for coupling to a cable;
a robotic accessor coupled to a second interface for coupling to the cable, the robotic accessor being configured to transport data storage media from a storage slot, a slot cell, or a storage slot and a slot cell, to a drive;
a first portion of a testing system coupled to the control circuit, the first portion being configured to send a data testing signal through a data lead of the cable via the first interface, the first portion being configured to send a power signal through a power lead of the cable via the first interface; and
a second portion of the testing system on the robotic accessor, the second portion being configured to receive and analyze the data testing signal from the data lead of the cable via the second interface, the second portion being configured to receive and analyze the power signal passing through the power lead of the cable via the second interface.

11. A system as recited in claim 10, wherein the first portion is configured to send the data testing signal and the power signal concurrently.

12. A system as recited in claim 10, wherein the second portion is configured to determine both an integrity and a quality of the data testing signal.

13. A system as recited in claim 10, wherein the second portion is configured to compare data extracted from the data testing signal to data sent by the first portion.

14. A system as recited in claim 10, wherein the second portion is configured to compare an impedance of the power lead, or derivative thereof, to a value and output a result of the comparing.

15. A system as recited in claim 10, wherein the first and second portion are configured to perform data testing, power testing, or data testing and power testing, at least two times in sequence.

16. A system as recited in claim 10, wherein the robotic accessor is configured to transport tape cartridges.

17. A computer-implemented method, comprising:
receiving and analyzing a data testing signal from a data lead of a cable via an interface; and
receiving and analyzing a power signal passing through a power lead of the cable via the interface,
wherein the receiving and analyzing the data testing signal is performed concurrently with the receiving and analyzing the power signal.

18. The computer-implemented method as recited in claim 17, wherein both an integrity and a quality of the data testing signal is determined.

19. The computer-implemented method as recited in claim 17, wherein a voltage of the data testing signal is less than a voltage of the power signal.

20. The computer-implemented method as recited in claim 17, wherein the data testing signal is an alternating current (AC) data testing signal, or the power signal is an AC power signal, or the data testing signal is an AC data testing signal and the power signal is an AC power signal.

* * * * *